United States Patent [19]

Bell et al.

[11] Patent Number: 4,926,792

[45] Date of Patent: May 22, 1990

[54] APPARATUS AND PROCESS FOR COLORING OBJECTS BY PLASMA COATING

[75] Inventors: James A. E. Bell; Bruce R. Conard, both of Oakville, Canada

[73] Assignee: Inco Limited, Toronto, Canada

[21] Appl. No.: 393,054

[22] Filed: Aug. 10, 1989

Related U.S. Application Data

[63] Continuation of Ser. No. 198,189, May 23, 1988, abandoned.

[30] Foreign Application Priority Data

May 29, 1987 [CA] Canada ................................. 538430

[51] Int. Cl.⁵ .............................................. B05C 1/02
[52] U.S. Cl. ..................................... 118/729; 118/50; 219/121.58
[58] Field of Search .................. 219/121.58; 118/715, 118/719, 728, 729, 722, 50

[56] References Cited

U.S. PATENT DOCUMENTS

| | | | |
|---|---|---|---|
| 2,746,420 | 5/1956 | Steigerwald | 118/8 |
| 3,717,119 | 2/1973 | Boys et al. | 118/729 |
| 3,926,147 | 12/1975 | Steube | 118/49.1 |
| 4,276,855 | 7/1981 | Seddon | 118/719 |
| 4,550,239 | 10/1985 | Uehara et al. | 219/121.58 |
| 4,582,720 | 4/1986 | Yamazaki | 118/729 |
| 4,650,064 | 3/1987 | Slabaugh | 118/500 X |
| 4,668,479 | 5/1987 | Manabe et al. | 118/729 |
| 4,709,655 | 12/1987 | Mastrigt | 118/719 |
| 4,775,281 | 10/1988 | Prentakis | 118/729 |
| 4,818,169 | 4/1989 | Schram | 118/729 |

FOREIGN PATENT DOCUMENTS

| | | |
|---|---|---|
| 8711193 | 11/1987 | Denmark . |
| 979772 | 5/1951 | France . |
| 2412620 | 7/1979 | France . |
| 2423551 | 11/1979 | France . |

OTHER PUBLICATIONS

Xerox Disclosure Journal-vol. 9, No. 3, May/Jun. 1984, pp. 173-175.
Patent Abstracts of Japan & Japan A-58 217 674 (Citizen Tokei K.K.), Dec. 12, 1983.
Sputtering Apparatus, Pat. Abs. of Japan-Japan A 56-41375, 4-18-1981.

*Primary Examiner*—Willard Hoag
*Attorney, Agent, or Firm*—Francis J. Mulligan, Jr.; Edward A. Steen

[57] ABSTRACT

A technique for presenting and fixturing small items that are coated by vapor deposition techniques. The objects are caused to be moved within the plasma stream to effect full coverage. The coating, if titanium nitride, is gold colored and is, for example, useful for coinage applications.

7 Claims, 3 Drawing Sheets

APPARATUS AND PROCESS FOR COLORING OBJECTS BY PLASMA COATING

This is a continuation of copending application(s) Ser. No. 07/198,189 filed on May 23 1988, now abandoned.

TECHNICAL FIELD

The instant invention relates to coating objects in general and, more particularly, to a process for coating large quantities of mass produced metallic objects, such as coins, ball bearings, keys, etc. with a corrosion and wear resistant protective colored film by employing physical or chemical vapor deposition ("PVD" or "CVD") techniques.

BACKGROUND ART

For some time it has been known that highly corrosion and wear resistant films may be deposited on metallic surfaces by a number of PVD or CVD processes. Common applications include aerospace, nuclear and tool materials. Indeed the gold colored, premium cost, tools available to industry and consumers generally have a thin surface layer of titanium nitride (TiN) applied onto them by PVD techniques. TiN has demonstrably increased the lifetime of drilling and cutting tools several times when compared to similar non-coated tools.

Various substances, such as TiN, TiC, ZrN, HfN, TaN, TiAlN, $TiO_2$, $ZrO_2$, $HfO_2$, $Ta_2O_5$, etc. have been synthesized by vapor deposition processes as coating materials. These materials exhibit a number of special properties.

Tools or larger parts are exclusively coated by a batchwise PVD technique. The parts are placed in a reactor on a table-like fixture and then coated. In some cases the parts are placed in a Christmas tree-like fixture mounted on a rotatable table. Loading and unloading of parts is thus labor intensive. Accordingly, table-type fixturing devices are preferred to be used in the coating of relatively expensive parts. The cost for table-fixture coating these parts might appear quite high in absolute terms but is not too significant in relation to the total cost of the parts. For example, coating costs of 0.50 cents per piece that normally sell for $10 may be a tolerable expense. However, the same coating cost cannot be justified for parts of very low cost.

Accordingly, vapor deposition technology has been selectively applied to microelectronics and a variety of relatively higher priced consumer goods. However, the technology has not been applied in situations where the coating of large quantities of inexpensive objects is required. One such area is the production of coins, coin blanks, discs, medals, tokens, ball bearings, etc. For example, the surface of coins must have an attractive appearance that should be retained for a long time while the coins are in circulation. Thus it is required that the coating exhibit high corrosion and wear resistances.

Recently, there has been a decided push towards the development and usage of gold colored coinage. See, for example, Canadian Patent No. 1,203,723 and note the recent introduction of the golden color Canadian dollar coin. The British pound, Australian dollar, French 10 franc and Spanish 100 peseta have also been recently issued in a variety of bronzes.

Experiments dealing with titanium nitride deposition on various coins using a reactive plasma spraying system developed by Multi-Arc Vacuum Systems Inc. of St. Paul, Minn. have been conducted by applicant. It has been determined that coins of a very attractive golden appearance, which could be retained for at least 20 years in circulation, may be produced by depositing approximately a one micron thick TiN layer on the coins.

Briefly, the PVD system employed for the experiments included a grounded closed chamber (reactor) comprising a pair of negatively charged power supplies (−17.5 volts) communicating with a corresponding pair of metal evaporators (cathodes) disposed within the reactor. When energized, the evaporators (in this case titanium evaporators) emitted a plasma stream of positively charged titanium ions. A fixture table, negatively charged by an external bias supply (−150 to −400 volts) and used for supporting the materials to be coated, was also disposed within the reactor and positioned to be bombarded by the titanium ions. A vacuum pump and means for supplying a reactive gas (such as nitrogen) to the reactor completed the system.

In operation, the titanium ions are attracted to and bond to the table and objects thereon. By introducing the reactive gas into the chamber, the nitrogen and titanium combine on the substrate forming TiN—a hard, corrosion resistant gold colored coating.

However, production problems associated with handling and fixturing the coins were encountered. The slow production rate would be a severe constraint in making the process economically feasible when using the table fixture. The coins to be coated had be placed on the table in a single layer. During deposition only the upper side of coins (exposed to the Ti cathode) were coated. Therefore following the coating of the exposed coin side, the reactor had to be opened, the coins cleaned and then put on the table with the other side up. The coating process then had to be repeated.

Thus it could be seen that the process was slow, labor intensive and, as a consequence, not economically feasible for use with small objects. The system, as it stood, precluded the economic coating of small parts.

SUMMARY OF THE INVENTION

Accordingly, there is provided an economical technique for coating objects. Storage means, such as a rack adapted to locomote the objects and positioned within a reactor, is disposed between two opposed evaporators.

The rack, capable of holding a large number of objects, presents a plurality of object sides to the evaporators. By moving the rack (tilting through a predetermined arc in one embodiment), the objects are further rotated to allow full exposure to the plasma streams emanating from the evaporators.

PREFERRED MODE FOR CARRYING OUT THE INVENTION

Figure 1:
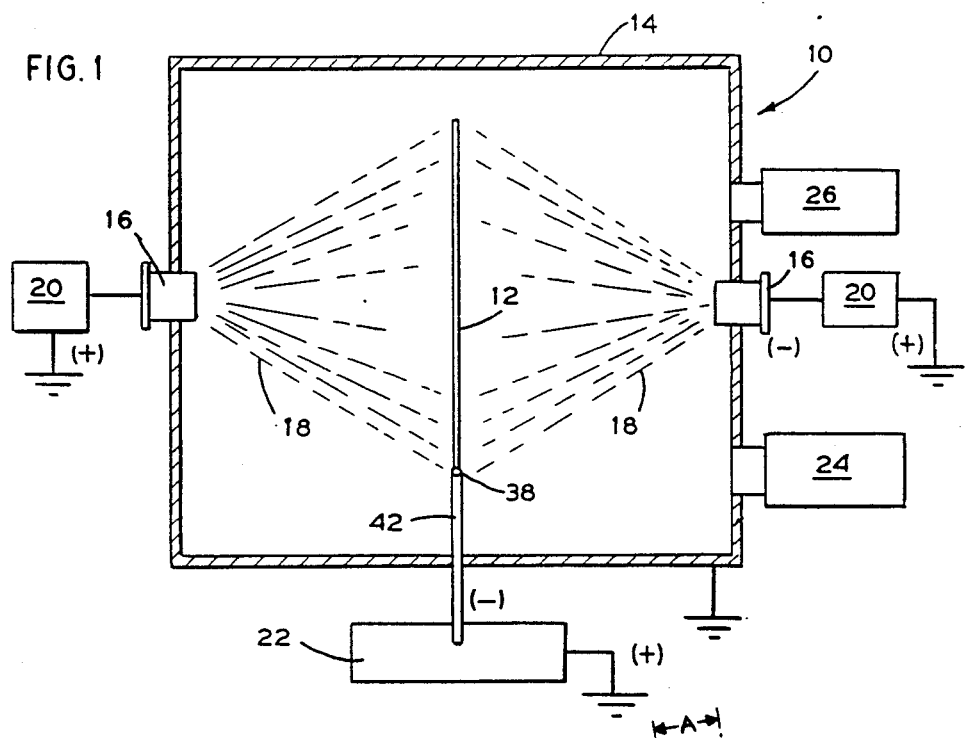
FIG. 1 is an end schematic view of an embodiment of the invention.
Figure 2:
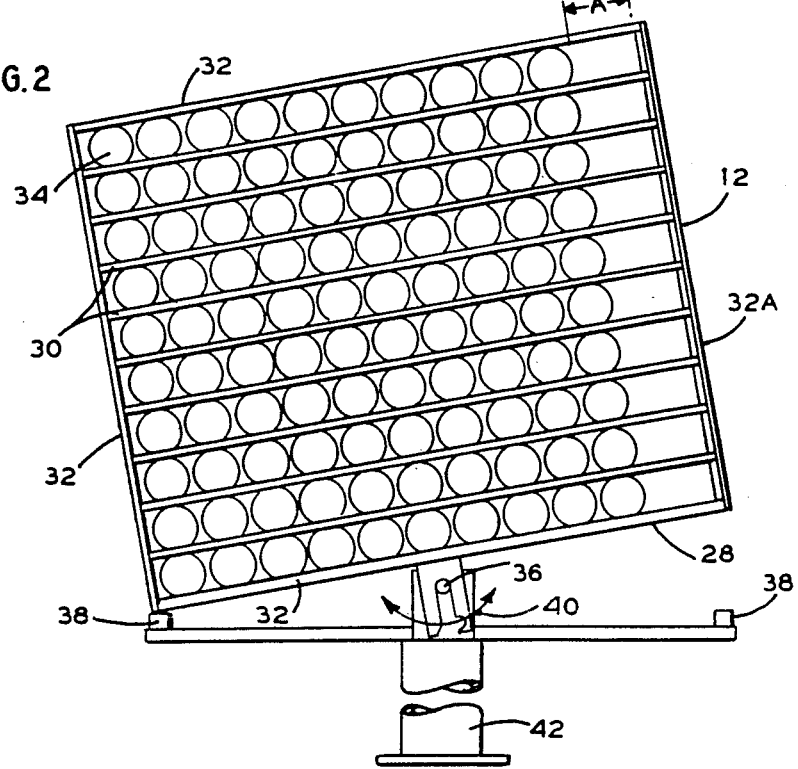
FIG. 2 is an elevation of a feature of the invention.

Referring to FIGS. 1 and 2 there is shown a coating reactor 10 and an object rack 12 respectively.

The reactor 10 includes a sealable chamber 14. At least two opposed evaporators 16 are disposed toward the interior of the chamber 14 so as to generate charged ionic plasma streams 18 which are accelerated toward the rack 12 (shown in an end view in FIG. 1). It is preferred to orient at least two of the evaporators 16 in an opposed parallel fashion on opposite sides of the chamber 14 so as to simultaneously and fully bathe both sides of the objects stored on the rack 12 completely and evenly in the plasma streams 18. Additional evaporators 16 (not shown) may be positioned as necessary.

The evaporators 16 are electrically connected to conventional power supplies 20 and their attendant controls. The rack 12 is electrically connected to a conventional power supply and control 22.

Vacuum pump 24 draws a vacuum in the chamber 14. Reactive gas source 26 provides the appropriate gas such as nitrogen, carbon, oxygen, etc. into the chamber 14.

FIG. 2 depicts the object rack 12. In the embodiment shown, the electrically conductive rack 12 consists of an open frame structure 28 having a plurality of parallel spaced races 30 and supporting sides 32. One side 32A of the frame 28 opens to permit the introduction and removal of objects 34 which, in this instance, are coins. A lockable removable slide, hinged member, or similar construction constituting the side 32A, permits entrance and egress to and from the races 30. The expression "object" shall be construed to include coins, coin blanks, discs, tokens, medals, keys, ball bearings and other similarly dimensioned mass produced products.

The frame 28 is pivotally mounted, via pin 36, on support structure 42. Stops 38 act as limits as the frame 28 is pivoted through arc 40. The support structure 42 electrically communicates with the power supply and control 22.

It was realized that in order to make coating of the coins 34 economically feasible, both coin sides had to be coated simultaneously. Consequently the rack 12 shown in FIG. 2 was developed. The rack 12 loaded, for example, with the coins 34 is located between the evaporators 16 as shown in FIG. 1. The spacing of the races 30 is such that the coins 34 can be moved freely while preventing their release from the frame 28. During coating, the rack 12 is oscillated through the arc 40 of about 5 to 10 degrees sideways causing the coins 34 to roll from side to side. The length of the races 30 are longer than the total length of coins 34 in the races 30 so that the space marked "A" in FIG. 2 is left between the coins 34 and the side 32 (or 32A). The extent of dimension A is such that as the rack 12 is rotated from side to side the coins 34 are rotated in multiples of quarter turns, i.e., approximately ¼ or ¾ or 1¼ revolutions. This facilitates coating the entire coin 34 surface. It should be noted that if the coins 34 were not oscillating in the races 30, the coin 34 portions shaded by the races 30 would not be coated. Oscillation of the frame 28 may be caused by any suitable driving mechanism, such as eccentric cams contacting the frame 28, alternating magnetic contacts, reciprocating plungers, etc.

The invention and manner of applying it may be better understood by a brief discussion of the principles underlying the invention.

A number of experiments were conducted to determine the efficacy of the instant technique using the equipment depicted in FIGS. 1 and 2. For larger scale operations the reactor system 44 shown in FIGS. 3 and 4 may be employed.

Figure 3:
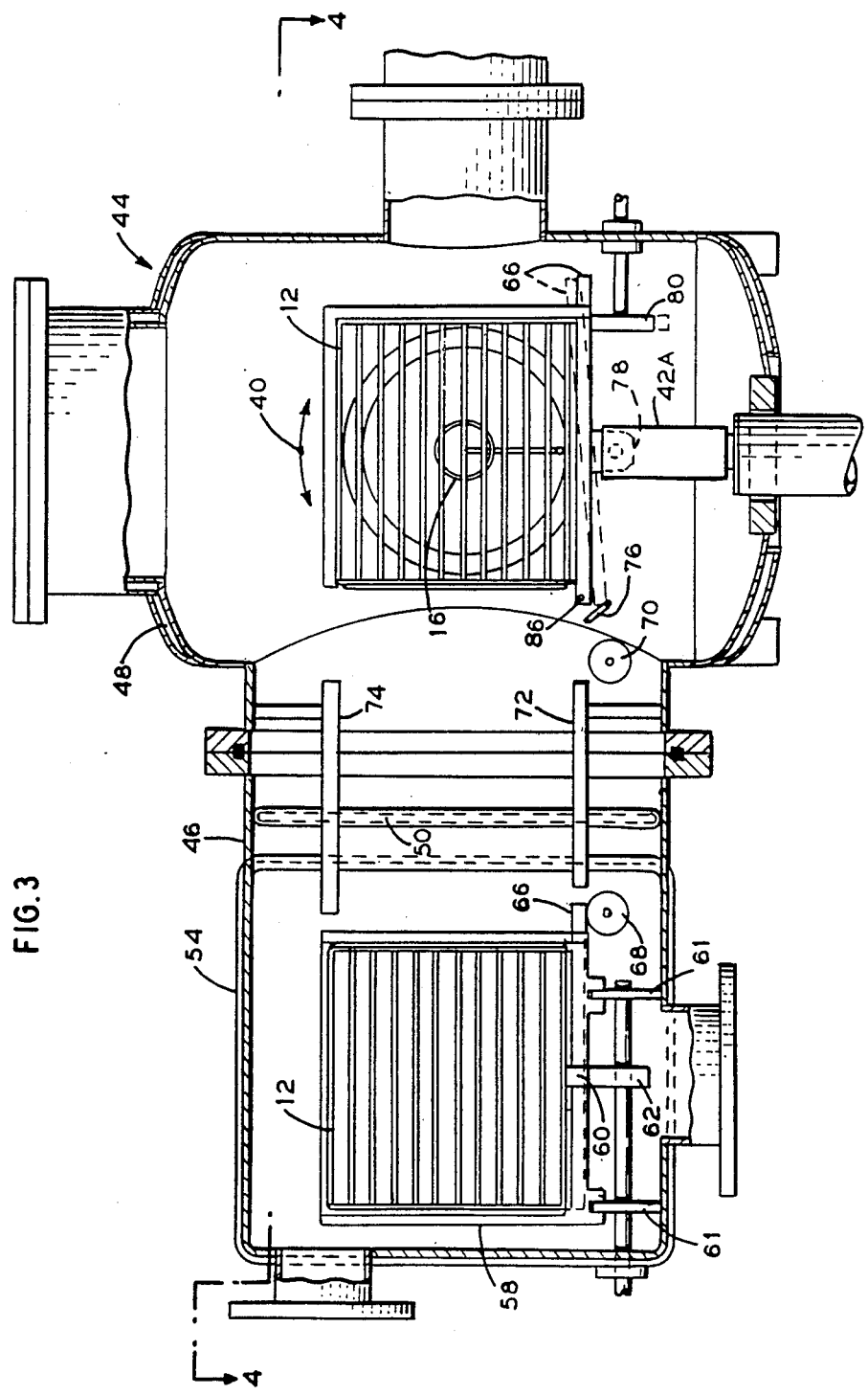
FIG. 3 is a cross sectional elevation of an embodiment of the invention.
Figure 4:
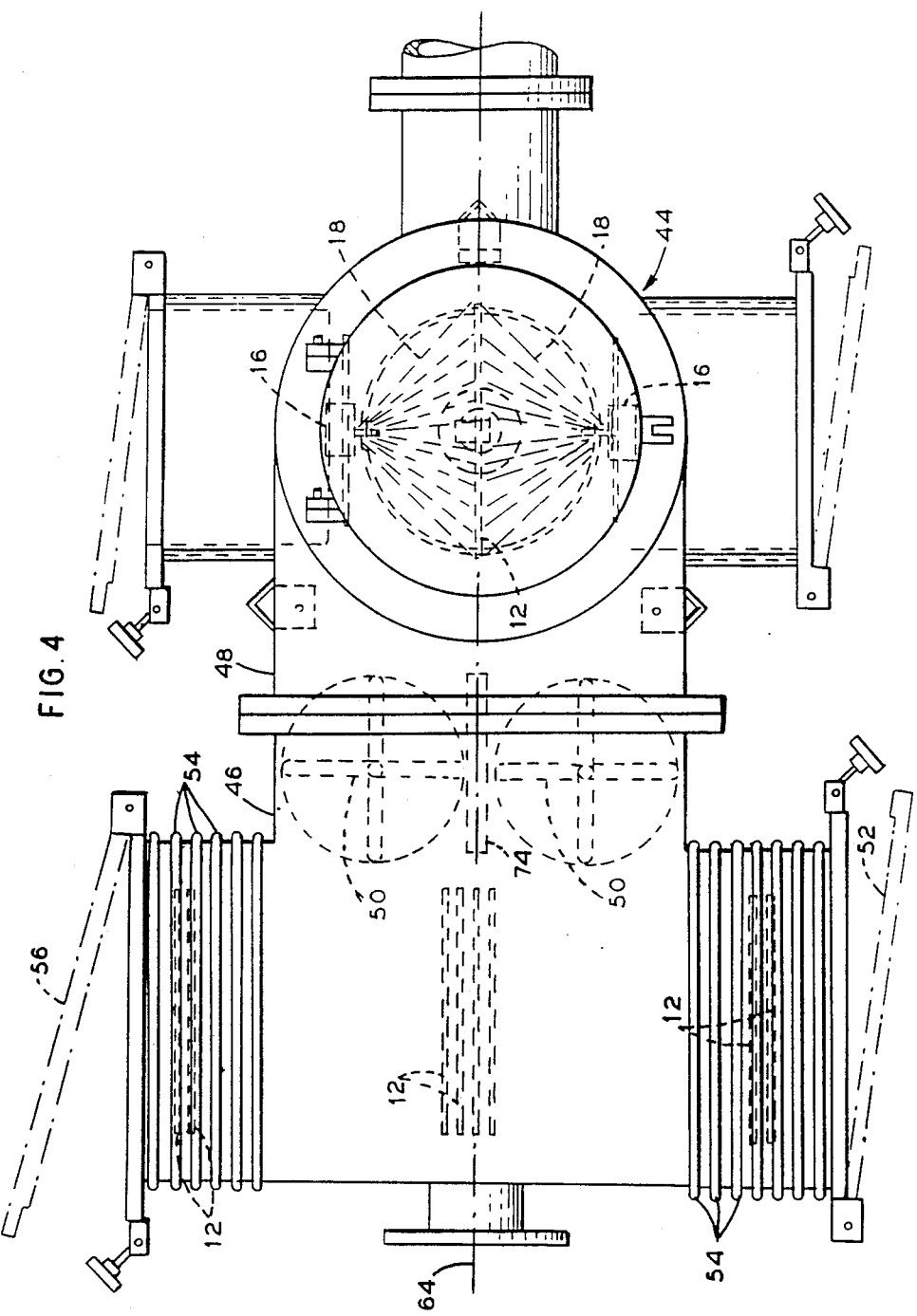
FIG. 4 is a plan view of FIG. 3 taken along line 4—4 of FIG. 3.

Referring to FIGS. 3 and 4, the reactor system 44 comprises two connected vessels 46 and 48 divided by baffles 50.

The first vessel 46 is used for storage of the racks 12 and the second vessel 48 is used for coating. As previously discussed, a single rack 12 is coated simultaneously from at least both sides. After the coating process is completed the rack 12 is moved from the coating reactor 48 to the storage vessel 46 and another rack 12 is brought in from the storage vessel 46 to the coating reactor 48. The process is repeated until the desired number of racks 12 are coated. The reactor system 44 is sealed and under a high vacuum during the entire process. The reactor system 44 may accommodate up to thirty or more racks 12. The rack 12 size depends on the size of the reactor employed and the objects to be coated. It is expected that a rack 12 capacity of about 1000 coins is manageable. Thus assuming thirty racks 12 having 1000 coins each, 30,000 coins can be charged into reactor system 44. This improves the productivity of coating to such a degree that the lowered coating cost per coin becomes acceptable.

The manipulation of the racks 12 within the reactor system 44 can be performed automatically on a time present basis using available driving mechanisms and programmable controllers. The driving mechanisms will index and shuttle the racks 12 within both vessels 46 and 48. Upon introduction into the reactor vessel 48, the rack 12 is oscillated through the arc 40 to ensure complete coating coverage by the plasma streams 18 emanating from the opposed evaporators 16.

The racks 12 are loaded with coins outside the reactor system 44. The loaded racks 12 pass through a cleaning line (not shown) where the coins are cleaned and dried. A plurality of racks 12 are loaded into cassette 58 and are charged into the storage vessel 46 via door 52. Each cassette 58 includes indexing rack 60. The indexing rack 60 is registered against corresponding first pinion 62. The rack/pinion combination 60 and 62 propels the cassette 58 into and out of the storage vessel 46 on support guides 61 and, in addition, by selectively positioning each rack 12 in the appropriate position within the storage vessel 46, ensures that each rack 12 is introduced into the reactor vessel 48.

Each rack 12 includes a lower toothed extension 66 which is sized to contact second pinion 68. After the cassette 58 is indexed to bring a rack 12 coincident with the axis of symmetry 64, the second pinion 68 rotates to draw the rack 12 out of the cassette 58 and pass it over to third pinion 70. Guides 72 and 74 prevent the rack 12 from falling over.

Rotating flipper 76 engages the extension 66 to translate the rack 12 into holding member 86. The member 86 is adapted to accommodate the rack 12. A projection 78 extending from the lower arm of the member 86 is pivotally mounted within support 42A to permit limited oscillatory movement of the member 86 and the rack 12 through the arc 40. Eccentric cam 80 provides the impetus to the member 86.

Upon completion of the process, the indexing technique is reversed so that the rack 12 is reintroduced into the cassette 58. After the cam 80 ceases revolving, the flipper 76 rotates in the opposite direction (counterclockwise in FIG. 3) to hand off the rack 12 back to the third pinion 70 and then ultimately back to the second pinion 68 and home in the cassette 58.

After the rack 12 is safely positioned back within the cassette 58, the first pinion 62 rotates a predetermined distance so as to simultaneously push the cassette 58 and the just treated frame 12 forwardly and place a new rack 12 in position. This indexing, shuttling operation and return cycle is repeated until all of the racks 12 in the cassette 58 have been treated.

Initially, after the cassette 58 is positioned in the storage vessel 46, the reactor system 44 is then sealed and evacuated to the desired pressure (or vacuum). The indexing/shuttling mechanism moves the racks 12 to the center of the storage vessel 46 and then into the coating reactor 48 as discussed above. Microprocessors and sensing devices may be utilized to oversee and operate the apparatus and method.

Rotatable water cooled baffles 50, located midway the storage vessel 46 and the coating reactor 48 close. The purpose of these baffles 50 is to prevent the ions from entering the storage vessel 46 during the reacting process which is maintained at a relatively cool temperature by cooling coils 54. It is not desirable to allow stray plasma to contact the components stored in the storage vessel 46.

After proper rack 12 orientation, the oscillating mechanism 80 is energized and a suitably high negative potential is applied to the rack 12. A high current (30-150 amperes) is applied to the evaporators 16. The plasma 18 is initiated by established procedures. As the negative potential is applied to the rack 12 and in the absence of a reacting gas, the coins are sputtered (bombarded) by the titanium or other metal ions.

After the desired sputtering period, which can be about one to five minutes, the rack 12 potential is reduced and the reacting gas (nitrogen in the case of TiN coating) may be introduced into the reactor 48. This initiates the TiN reaction on the coins which may be conducted for about five to sixty minutes. This reactive time depends upon: the desired film thickness to be deposited, cathode or evaporator current, rack (substrate) potential, nitrogen partial pressure, and cathode-substrate distance. During the sputtering and reacting periods the objects 34 are heated during their bombardment by the ions and reacting gas molecules. It is important to select the coating variables within such limits so that the temperature of the objects does not approach their softening point. Otherwise the wear resistance of the coated objects 34 would be reduced.

The coating reactor 48 has at least a pair of opposed parallel evaporators 16 on both sides of the frame 12. The spacing of these evaporators with respect to each other is very important and should be such that it gives a fairly uniform coat of thickness.

For a 1 micron thick TiN deposit, which was found to be sufficient for nickel coinage, the preferred coating conditions are as follows:

| | |
|---|---|
| Evaporator Current | 30-150 amperes |
| Substrate (Rack) Potential | 100-400 volts (negative) |
| Cathode - Substrate Distance | 0.15-0.3 meters |
| Cathode - Cathode Distance | 0.3-0.6 meters |

In order to increase the production rate, it is necessary to minimize the coating time. It has been calculated that the optimal coating time for coinage is about ten minutes.

After the predetermined coating period, the reactive gas, the evaporator current, the rack potential, and the oscillating mechanism 80 are shut off. The rack 12 is removed from the coating reactor 48 and reintroduced into the storage vessel 46 after opening the baffles 50 as discussed above.

Then a second rack 12 is brought from the storage vessel 46, placed into the coating reactor 48 and the cycle is repeated.

When all of the racks 12 have been coated, the reactor system 44 is vented and opened. The cassette 58 is unloaded via door 56 and the system is cleaned of Ti and TiN dust. Then a new set of object loaded racks 12 is charged into the storage vessel 46 and the process begins anew.

A number of experiments utilizing the apparatus depicted in FIGS. 1 and 2 confirmed the efficacy of the instant technique. The rack 12 was oscillated manually.

EXAMPLE 1

A rack 12 loaded with Canadian $1 blanks (made of nickel) was coated under the following conditions:

| | |
|---|---|
| Evaporator Current | 90 amperes |
| Evaporator - Substrate (Coin) Distance | 0.305 meters |
| Substrate Potential | −100 volts |
| Coating Time | 30 minutes |
| $N_2$ Pressure | 1.74 mewtons/meter$^2$ |
| No. of Evaporators/ft$^2$ (0.1 m$^2$) of Substrate Area | 1 per each side |
| Maximum Coating Temperature | 800° F. (427° C.) |

Approximately a one micron thick layer of TiN was deposited which had a very attractive golden appearance.

The produced coins were tested for wear using a tumbling product tester. After fourteen days of continuous testing, which is equivalent to about eighteen years of a normal circulation wear, the coins retained an attractive golden appearance.

EXAMPLE 2

Various other coins were coated using the rack 12 at variable conditions:

| | |
|---|---|
| Evaporator Current | 20-150 amperes |
| Evaporator Substrate Distance | 0.15-0.395 meters |
| Substrate Potential | −100 to −400 volts |
| Coating Time | 10-120 minutes |
| $N_2$ Pressure | 1-10 newtons/meter$^2$ |

In summary, all coins or blanks of nickel origin showed very attractive golden appearance after TiN coating and exhibited a superior wear resistance to non-coated pieces.

It should be noted that although the examples and the drawings relate to nickel coins, the invention is not restricted to any particular object or material. Many different mass produced objects may be coated by this invention, such as ball bearings, keys and other small parts. The rack should understandably be altered to suit the particular object being coated. For example, the racks may be of different shape and spiralled for coating ball bearings. This would allow the ball bearings to be fully rotated. For coating keys the racks could have hanging pins. Another alternative would have the objects disposed along a high receptacle and caused to travel downwardly through a vertically oriented twisted and/or serpentine race into a lower receptacle. This scheme, utilizing gravity, would cause the objects to be evenly exposed to the plasma stream 18.

Additionally the invention is not restricted to TiN deposition since it is applicable to other coating materials. For example, other metallic coatings which are amenable to reactive plasma coating, such as TiC, ZrN, HfN, TaN, TiAlN, etc. may be employed.

In addition, the instant invention may be used for applying elemental coatings onto the objects, without the use of a reactive gas. For example, coatings of Ti, Zr, Ta, Al, Cr, etc. may be applied by evaporating them onto the objects disposed on the racks.

It should also be appreciated that other means can be provided to shuttle and index the racks into and out of the reactor vessel. For instance, a two-chamber device with a valve disposed therebetween can be used. In this arrangement the first chamber acts as a vacuum lock and the second chamber acts as the reactor and only two racks are present in the apparatus at any one time. Moreover, overhead travelling hooks, piston actuated grabbing arms, screw drive draws, etc. may be utilized to position and index the frames 12 within the vessels. Applicant does not wish to be limited to the specific positioning, indexing, and oscillatory embodiments depicted herein.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or priviledge is claimed or defined as follows:

1. An apparatus for plasma coating objects, the system comprising a sealable reactor chamber, means for introducing at least one ionic plasma stream into the reactor, an object of storage means disposed within the reactor chamber situated to receive the ionic plasma stream, the improvement comprising the object storage means including four peripheral sides defining a substantially open frame, a plurality of spaced parallel longitudinal races bridging two opposed sides, the longitudinal races adapted to hold the objects and allow rotational and continuous reciprocating translational locomotion of the objects along the length of the races, the length of each longitudinal race being longer than the total length of the objects situated within the longitudinal race, the open frame pivotally mounted on a support disposed within the reactor, and the support adapted to repetitively tilt the open frame through a predetermined arc to effect object locomotion within the races.

2. The apparatus according to claim 1 wherein one side of the open frame opens to permit access to the races.

3. The apparatus according to claim 1 including a pair of opposed ionic plasma stream sources positioned to bathe the object storage means from opposite directions when the open frame is being tilted.

4. The apparatus according to claim 1 including means for repetitively tilting the object storage means disposed within the reactor.

5. The apparatus according to claim 1 including a storage vessel communicating with the reactor chamber, shuttle means for transporting the object storage means from the storage vessel to the reactor chamber and back again.

6. The apparatus according to claim 1 wherein a plurality of object storage means are mounted within a cassette disposed within the storage vessel.

7. The apparatus to claim 6 including means for positioning the cassette at a predetermined location with the storage vessel.

* * * * *

UNITED STATES PATENT AND TRADEMARK OFFICE
CERTIFICATE OF CORRECTION

PATENT NO. : 4,926,792

DATED : MAY 22, 1990

INVENTOR(S) : JAMES ALEXANDER EVERT BELL, BRUCE RANDOLPH CONARD, JURAJ BABJAK & RAYMOND AUGUSTUS BRADFORD

It is certified that error appears in the above-identified patent and that said Letters Patent is hereby corrected as shown below:

On the front page: Add Juraj Babjar and Raymond Augustus Bradford as co-inventors.

Signed and Sealed this

Ninth Day of July, 1991

Attest:

HARRY F. MANBECK, JR.

Attesting Officer

Commissioner of Patents and Trademarks